United States Patent [19]

Kozak, Jr.

[11] 4,355,417
[45] Oct. 19, 1982

[54] SQUELCH CONTROL CIRCUIT FOR AMPLITUDE MODULATED RF RECEIVERS

[76] Inventor: Joseph H. Kozak, Jr., 62 Bryan's Rd. Trailer Park, Bryan's Rd., Md. 20616

[21] Appl. No.: 140,465

[22] Filed: Apr. 17, 1980

Related U.S. Application Data

[63] Continuation of Ser. No. 835,455, Sep. 22, 1977, abandoned.

[51] Int. Cl.³ .............................................. H04B 1/10
[52] U.S. Cl. ................................. 455/218; 455/237; 455/310
[58] Field of Search .............. 455/203, 212, 218, 219, 455/221–223, 237, 310, 312

[56] References Cited

U.S. PATENT DOCUMENTS

| 2,853,601 | 9/1958 | McKenna et al. | 455/247 |
| 3,100,871 | 8/1963 | Richardson et al. | 455/203 |
| 3,320,535 | 5/1967 | Broadhead, Jr. | 455/203 |
| 3,358,234 | 12/1967 | Stover | 455/203 |
| 3,939,425 | 2/1976 | Toyoshima | 455/222 |

*Primary Examiner*—Jin F. Ng
*Attorney, Agent, or Firm*—Shlesinger, Arkwright, Garvey & Dinsmore

[57] ABSTRACT

A noise squelching circuit for an AM radio in which a phase-locked loop extracts a tone signal which gates an audio frequency amplifier. Tone injection can be accomplished either by frequency modulating the intermediate frequency signal or the output of the phase-locked loop's voltage controlled oscillator.

8 Claims, 2 Drawing Figures

SQUELCH CONTROL CIRCUIT FOR AMPLITUDE MODULATED RF RECEIVERS

This is a continuation, of application Ser. No. 835,455, filed Sept. 22, 1977, now abandoned.

FIELD OF INVENTION AND BACKGROUND

This invention relates to AM radio squelch circuitry. Specifically it involves the use of a phase-locked loop to extract a tone which in turn gates the receiver output. Conventional squelch circuits operate by sampling the magnitude of the automatic gain control (AGC) voltage of the receiver and sending a gating voltage to an audio amplifier, so as to prevent reception of noise in the absence of a signal. The AGC voltage required for squelch operation is adjustable with a front panel control to provide silencing of the receiver at different noise levels.

Problems with this type of squelch circuit arise when varying noise levels are encountered and weak signals must be received. Also strong noise will cause the receiver to develop an AGC voltage, sometimes many times greater than the AGC voltage developed by the desired signals. Constant readjustment of the control is required under these conditions. Weak signals are often lost entirely because they do not develop enough AGC voltage to operate the squelch circuit after the control has been adjusted for high noise levels.

When a nearby transmitter is operated on a frequency (or channel) near the frequency to which the receiver is tuned, a "bleedover" or "splatter" often results. Bleedover, often called co-channel interference, occurs when the transmitter signal is so strong that the receiver cannot reject the signal, even though the signal does not extend into the frequency band to which the receiver is tuned. This is a shortcoming of many inexpensive receivers. Splatter, often called adjacent channel interference, occurs when the nearby transmitter splashes sidebands (modulated signals) onto the frequency to which the receiver is tuned. The result of both bleedover and splatter is the same—strong bursts of noise so intense that no setting of the squelch control will eliminate them.

Control of squelch or muting of a receiver has been accomplished by means of tones in certain cases for some time. Certain FM broadcast stations transmit an inaudible tone simultaneously with certain program material; special tone sensing equipment in the receiver detects the tone and performs a squelch function by removing commercial messages from the receiver output. Other transmitters, either AM or FM, have certain messages preceded by tone transmissions consisting usually of two or more simultaneous or sequential tones. Special circuits in the receiver detect the proper tone combination and gate the receiver output so that the subsequent message can be received. The muting of the receiver can be either automatically reset after a certain time duration or manually reset.

Both of these tone actuated squelch or muting systems require some sort of special signal or tone to be transmitted by the transmitter in addition to the normal messages or data. The squelch concept that is the subject of this application, however, does not require any special signals or tones of any kind from the transmitter originating the signals.

Toyoshima, in U.S. Pat. No. 3,939,425, discloses a noise squelching circuit that uses a phase-locked loop which is tapped to gate the receiver output.

Farrow, in U.S. Pat. No. 3,619,785, Richardson in U.S. Pat. No. 3,100,871, Stover in U.S. Pat. No. 3,358,234 and Broderick in U.S. Pat. No. 3,541,449 disclose devices broadly similar to that of Toyoshima.

McKenna in U.S. Pat. No. 2,853,601, discloses an automatic gain control circuit in which a tone injected into a modulator is subsequently detected for gain control.

A feature of the squelch circuit that is the subject of this application is that it automatically adjusts to varying noise levels.

Another feature is that in the absence of strong noise it will operate on signals so weak as to be barely detectable.

Another feature is that it will reject most splatter and bleedover interference without manual readjustment of the squelch control and bleedover will not diminish the circuit's effectiveness.

Another feature is that a preset time delay is incorporated into the squelch system which prevents erroneous squelching. Moreover, an easily detectable tone signal is used to abort the squelching operation.

This squelch circuit uses a phase-locked loop to extract a continuous tone which gates the output of the AM receiver. In one embodiment, the tone frequency modulates the intermediate frequency (I.F.) signal at the second mixer. A phase-locked loop samples the I.F. signal before the second detector and is tuned within the I.F. bandwidth. The phase comparator in the phase-locked loop generates a correction signal after comparing the intermediate frequency signal and the voltage controlled oscillator output. This correction signal contains the continuous tone signal which is detected and used to gate the audio output of the receiver.

Alternatively, the continuous tone may frequency modulate the output of the voltage controlled oscillator in the phase-locked loop. In the phase comparator this frequency modulated signal is compared to the intermediate frequency signal. If the phase-locked loop is able to track the I.F. signal, the phase comparator output will contain, as a part of the necessary correction signals, a tone frequency component which will be detected and used to gate the audio output. Since this tone is inverted in phase compared to that supplied by the tone oscillator the tone component from the phase comparator will cancel the tone from the oscillator when the phase-locked loop is operating in the locked state.

Conventional circuits may be used to detect the tone signal and gate the receiver output. A bandpass filter followed by an amplifier and detector may be used. Alternatively the bandpass filter output is amplified and fed to one input of an exclusive NOR gate. The other input is supplied by the tone oscillator. The output of the NOR gate is then inverted and filtered.

DESCRIPTION OF THE INVENTION

Figure 1:
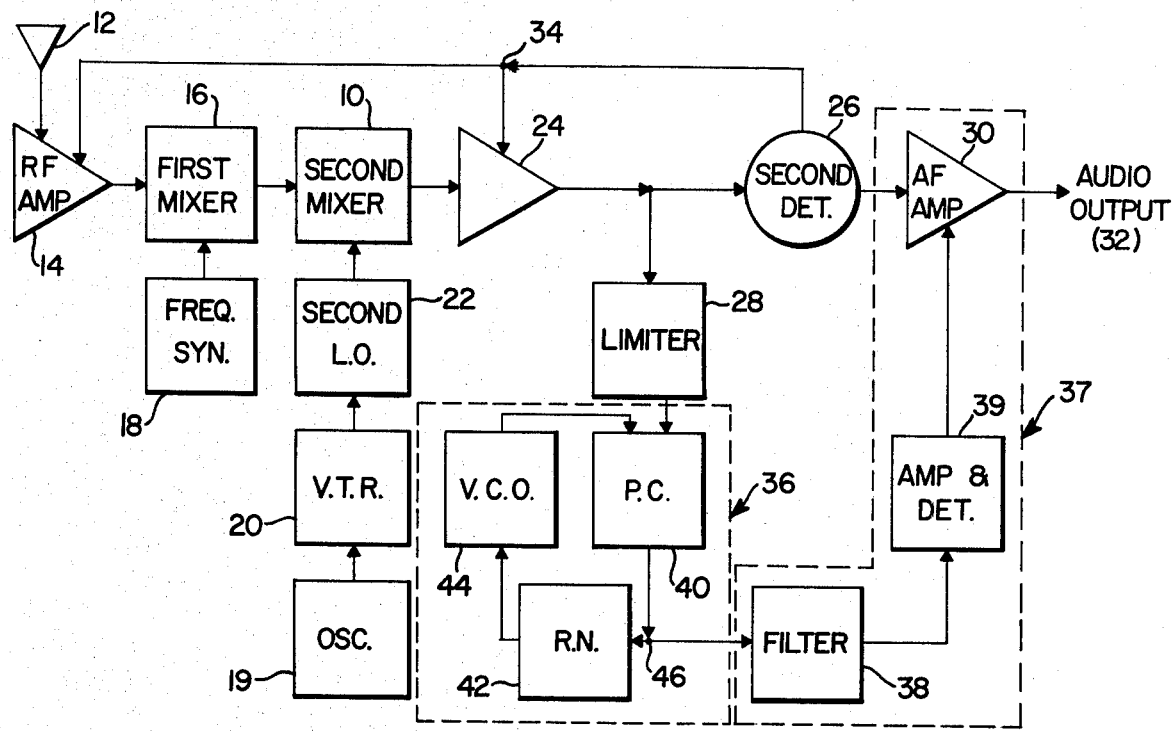
FIG. 1 is a schematic of the squelch circuit in which the intermediate frequency signal is frequency modulated with a continuous tone and a filter and detector are used to gate the audio output.

One of two embodiments of the phase-locked loop squelch circuit is shown in FIG. 1 in a dual conversion AM receiver, although it is also suitable for use in a triple conversion unit or any other non-single side band AM receiver. An intermediate frequency (I.F.) signal fed to the second mixer 10 is developed in a conventional manner from the antenna 12, radio frequency (RF) amplifier 14, first mixer 16 and frequency synthesizer 18.

The I.F. signal is frequency modulated in the second mixer 10 by tone oscillator 19, varactor 20, and second local oscillator 22. The tone from oscillator 19 is fed to varactor 20 which frequency modulates the output of the second local oscillator 22 i.e. the frequency of the second local oscillator varies with respect to the instantaneous voltage output from the tone oscillator 19. The frequency modulated output of the second local oscillator 22 is combined in the second mixer with the I.F. signal from first mixer 16 so that the output of the second mixer 10 is frequency modulated by impressing the frequency of the oscillator 19 on the incoming RF signal. The deviation of the frequency modulation of the I.F. signals will be equal to the deviation impressed upon the second local oscillator by the tone signal.

The frequency modulated I.F. signal from second mixer 10 enters I.F. amplifier and filter 24. The filter excludes frequencies outside the I.F. bandwidth and the amplifier amplifies the passed signal. In most cases the signal that leaves the amplifier and filter 24 has an amplitude varying from about 100 millivolts to several volts. The output from I.F. amplifier and filter 24 goes to second detector 26 and limited 28. The second detector 26 demodulates the AM signal and passes the detected signal on to audio frequency (A.F.) amplifier 30 and audio output 32. Since conventional second detectors are relatively insensitive to small deviation FM signals the FM component of the I.F. signal is effectively blocked by the second detector 26. If the oscillator 19, frequency f is made less than 400 Hertz any FM signal which passes the second detector will be eliminated in the audio system since conventional audio communication systems will not pass these low frequency signals. The output of the second detector 26 is also sampled to effect conventional automatic gain control (AGC) through path 34 which feeds back to I.F. amplifier and filter and R.F. amplifier 36.

The sample of the output of the I.F. amplifier and filter 24 which enters limited 28 is processed by phase-locked loop (P.L.L.) 36. The resistor diode limited 28 serves to protect the P.L.L.'s solid state circuits against excessive I.F. signal amplitudes, preferably limiting the I.F. signal to about 100 to 700 millivolts. The output from the P.L.L. 36 operates the gate circuit 37 which gates the receiver output. The gate circuit 37 shown in FIG. 1, uses bandpass filter 38 and amplifier and detector 39 to gate the output of the A.F. amplifier 30.

The phase-locked loop 36 has a phase comparator (P.C.) 40, resistor network 42 and voltage controlled oscillator (V.C.O.) 44. Its only input is from limiter 28 and its sole output is to the gating circuit 37. This output is taken from between the P.C. 40 and the resistor network 42.

The squelch circuit operates in this way. The P.C. 40 compares the I.F. input with the output signal from the V.C.O. 44. If a phase difference exists P.C. 40 applies a correction signal to the resistor network 42. Thus the P.L.L. 36 will lock onto or track the I.F. signal, frequency modulated with the tone of frequency f originating from oscillator 19. Moreover, the P.L.L. 36 is adjusted to operate within a selected frequency band by adjusting the resistances of resistors in the resistor network 42. This frequency band is preferably equal to or less than the I.F. frequency bandwidth. In the preferred form of this invention, assuming a conventional I.F. carrier frequency of 455 kilohertz and a 10 kilohertz bandwidth, a P.L.L. frequency band of 452 to 458 kilohertz is used.

The P.L.L. 36 will lock onto the input signal and track it through all frequency changes within the tracking frequency band. A carrier frequency outside the tracking frequency band will cause the P.C. 40 to send a maximum correction signal and the V.C.O. 44 will change its frequency to the frequency in the tracking band closest to that of the signal.

The phase-locked loop 36 frequency demodulates the input I.F. signal so that a demodulated frequency f from tone oscillator 19 appears at point 46. This is done by adjusting the frequency of the V.C.O. 44 so that the correction signal appearing at the output of the P.C. 40 is proportional to the frequency deviation of the I.F. signal. The P.C. 40 first produces signals having twice the frequency of the two input waveforms. A lowpass filter in resistor network 42 rejects any signals having a frequency substantially greater than the tone frequency originating in the oscillator 19 and passes the tone frequency, and other low frequencies and DC signals required for the P.L.L. operation. If the receiver is receiving no signal, of course, only noise will be present and the output of the P.C. 40 will not contain the tone frequency.

The tone frequency f is critical to the operation of the circuit because it is this component which operates the gate allowing the detected signal from the second detector 26 to pass to audio output 32. If the tone frequency f is present at point 46 indicating the device is tracking a signal, the gating circuit 37 will gate open A.F. amplifier 30. This will occur when filter 38 passes the tone frequency f signal and amplifier and detector 39 detects it. The frequency f determines the minimum period of time which the P.L.L. must track the I.F. signal before the tone can be recognized by gating circuit 37 or 48. For example, if the tone frequency f is 100 Hertz the P.L.L. must track the input signal for 1/100 of a second before one cycle will appear at 46. Since tracking is normally achieved within about 600 microseconds, the frequency of the tone is the limiting time factor in squelch operation.

The tone frequency f may be any frequency from subsonic to ultrasonic. In the preferred embodiment a frequency of 100 Hertz is used because the audio system is insensitive to this frequency and because it creates an appropriate tracking time requirement. However, even frequencies in the middle of the range to be reproduced by the receiver may be employed because of the insensitivity of the second detector 26 to FM and the insensitivity of the P.L.L. 36 to AM.

The squelch must gate the receiver output off when no tone signal is present or when splatter or bleedover occurs. When only random noise is present no FM signal will be conveyed, no tone signal will be detected by gate circuits 37 and 48 and the A.F. amplifier 36 will be turned off. When, as in the case of bleedover, a strong carrier frequency outside the band to which the receiver is tuned is received, P.L.L. 36 will not lock onto this signal because the tracking band of the P.L.L. 36 is adjusted to the desired carrier signal. Again gate circuit 37 detects no component of tone frequency f and the A.F. amplifier 30 is gated off.

In the case of either bleedover or splatter the correction signal from the phase comparator 40 consists of strong impulses resulting from the attempt to track noise pulses and short bursts of I.F. signals. These impulses bear no relationship to the tone signal and are not recognized by the gating circuit 37 or 38. It is possible that phase lock loop 36 may occasionally track modulating side bands from adjacent channels for short periods. However, since the loop 36 must track the incoming signal for one whole cycle of the tone frequency f before recognition, transient tracking will not diminish the effectiveness of the system.

Figure 2:
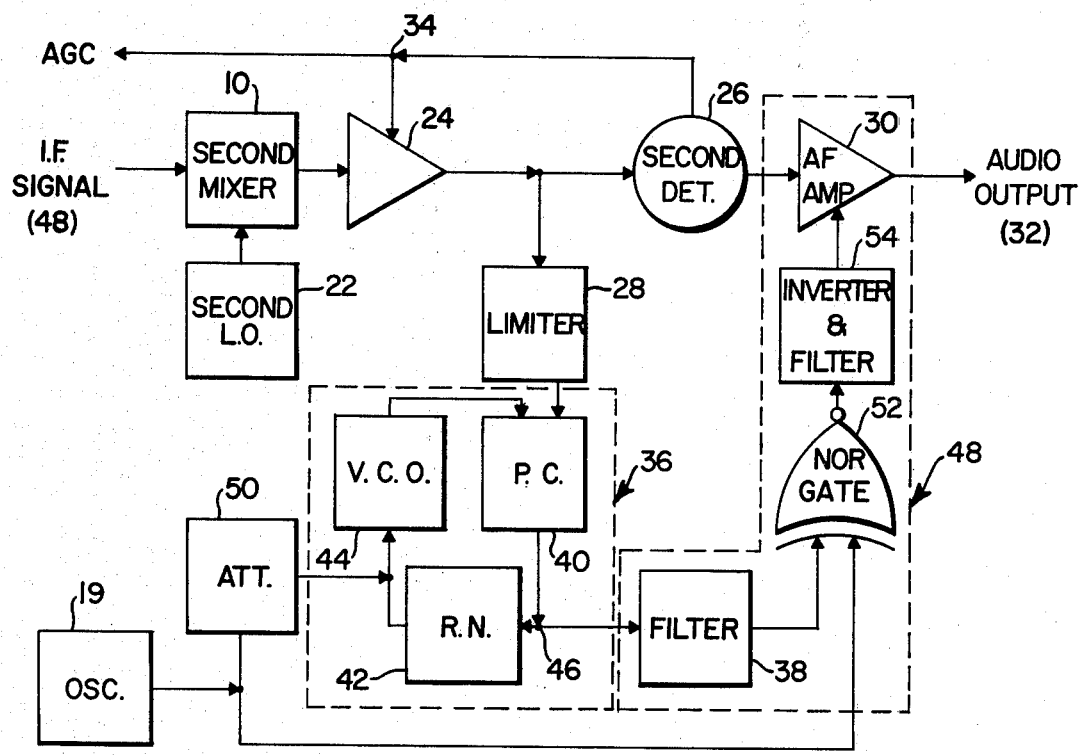
FIG. 2 is a schematic of the squelch circuit in which the voltage controlled oscillator output is frequency modulated with a continuous tone and a NOR gate is used to gate the audio output.

Phase-locked loop squelch may also be achieved using the circuit shown in FIG. 2 in a dual conversion AM receiver for illustration purposes. This circuit differs from that illustrated in FIG. 1 in that the tone signal is injected directly into the P.L.L. 36 between the V.C.O. 44 and the resistor network 42 using oscillator 19. The gate circuit 48 illustrated in FIG. 2 can be used interchangeably with the gate circuit 37 shown in FIG. 1.

In FIG. 2 a sine wave from oscillator 19, passed through attenuator 50, is superimposed on the correction signal between the resistor network and lowpass filter 42 and V.C.O. 44 at the juncture of the lines at point 45. Because of this, the output of the V.C.O. 44 is frequency modulated with the tone originating in oscillator 19 because the V.C.O. converts the voltage amplitudes appearing at its input into frequency variations.

As in the embodiment of FIG. 1, P.C. 40 compares the output from the V.C.O. 44 and the limited 28 and emits a correction signal to bring the two signals into phase-lock. If the P.L.L. 36 is able to track the input signal the output from the P.C. 40 will contain a signal having a component of tone frequency f injected by the oscillator 19. Since the P.C. 40 inverts its output 180°, the component of tone frequency f in the output of the P.C. 40 will cancel the tone frequency component from oscillator 19 at point 45 when it is applied to the V.C.O. input. This cancellation of the tone frequency from oscillator 19 will result in the V.C.O. 44 output signal having no frequencies modulation, a necessary requirement if the P.L.L. 36 is to maintain phase-lock with the incoming I.F. signal. The resistor network 42 contains a lowpass filter which eliminates the V.C.O. and I.F. frequency components and the correction signal is attenuated and filtered in resistor network and lowpass filter 42 to insure proper V.C.O. frequency control.

If only random noise is present at the receiver input the P.L.L. 36 will find no trackable frequency and will issue no correction signal. Therefore, the tone frequency will not appear at 46 and the receiver output will be gated off.

When the P.L.L. 36 has tracked the input for at least one cycle of the tone frequency f, the tone frequency f will be detected by gating circuit 48 or 37. The presence of the tone frequency f component indicates that the P.L.L. is locked onto the input signal. The waveform at point 46 is filtered by band-pass filter and amplifier 38 tuned to the tone frequency f and passed to one input of exclusive NOR gate 52. The other input to the NOR gate is supplied by oscillator 19. Since these signals are 180° out-of-phase the output of the NOR gate 52 will be low when phase-lock occurs because of the presence of the inverted frequency f at point 46. However, in the absence of phase-lock the output of the gate 52 will be high half of the time.

The output from the gate 52 is inverted and filtered and then applied as a gating voltage to audio amplifier 30. No signal will be allowed to pass through audio amplifier 30 to audio output 32 unless the phase-locked loop 36 is able to track the input signal from I.F. amplifier and filter 24. Since operation of the gating circuit 48 depends on the constant phase relationship between the tone oscillator signal and P.C. output signals, the squelch will not be triggered by signals near the tone frequency f that originate at sources other than the tone oscillator.

The squelch circuit can be incorporated in original equipment. It can also be installed into existing units with no change other than modification of the existing squelch circuit.

While this invention has been described as having a preferred design, it will be understood that it is capable of further modification. This application, is, therefore, intended to cover any variations, uses, or adaptations of the invention following the general principles thereof and including such departures from the present disclosure as come within known or customary practice in the art to which this invention pertains, and as may be applied to the essential features hereinbefore set forth and fall within the scope of this invention or the limits of the claims.

What is claimed is:

1. A squelch circuit for an amplitude modulated RF receiver, comprising:
   (a) radio frequency receiving means for producing an amplitude modulated signal and including a mixing stage for producing an intermediate frequency signal and which has an output connected to an intermediate frequency amplifier stage,
   (b) detector means connected to the output of the intermediate frequency amplifier stage for demodulating the amplitude modulated signal and blocking any FM component which may be in the signal,
   (c) an audio frequency amplifier connected to the output of the detector means for amplifying its output signal and passing it to an output line,
   (d) frequency modulation means connected to the output of the mixing stage for continuously impressing a frequency modulated signal at a preselected frequency value on the intermediate frequency signal,
   (e) a phase locked loop circuit connected to the output of the intermediate frequency amplifier for locking onto the received frequency modulated signal and tracking it through its frequency changes, and
   (f) means connected between the output of the phase locked loop and the audio frequency amplifier for gating the audio frequency amplifier off when the phase locked loop does not find the impressed frequency modulated signal.

2. The squelch circuit for the amplitude modulated RF receiver as set forth in claim 1, wherein:
   (a) the frequency modulation means includes frequency generating means which produces a frequency of less than 400 hertz.

3. The squelch circuit for the amplitude modulated RF receiver as set forth in claim 1, wherein:

(a) the frequency modulation means includes an oscillator for generating the frequency to be impressed on the amplitude modulated signal.

4. The squelch circuit for the amplitude modulated RF receiver as set forth in claim 1, wherein the frequency modulation means includes:
   (a) a tone oscillator for generating a basic frequency, and
   (b) a varactor for receiving the output from the tone oscillator and for producing a modulation signal, and a second local oscillator connected to the output of the varactor and controlled thereby, its output being connected to a second mixing stage.

5. The squelch circuit for the amplitude modulated RF receiver as set forth in claim 1 or 4, wherein:
   (a) a limiter is connected between the intermediate frequency amplifier and the phase locked loop circuit to protect the phase locked loop circuit from excessive intermediate frequency amplitudes.

6. The squelch circuit for the amplitude modulated RF receiver as set forth in claim 1, wherein:
   (a) the gating means includes a bandpass filter, and
   (b) an amplifier and detector circuit is connected to the output of the bandpass filter and has its output line connected to the audio frequency amplifier to thereby control gating of the audio frequency amplifier.

7. A squelch circuit for an amplitude modulated RF receiver, comprising:
   (a) radio frequency receiving means for producing an amplitude modulated signal and including a mixing stage for producing an intermediate frequency signal with a output connected to an intermediate frequency amplifier stage,
   (b) detector means connected to the output of the intermediate frequency amplifier stage for demodulating the amplitude modulated signal,
   (c) an audio frequency amplifier connected to the output of the detector means for amplifying its output signal and passing it to an output line,
   (d) a phase locked loop circuit connected to the output of the intermediate frequency amplifier for locking onto the received signal and tracking it through its frequency changes,
   (e) means for frequency modulating a tone signal with a voltage controlled oscillator signal from the phase locked loop,
   (f) means connected to the output of the phase locked loop and to the audio frequency amplifier for gating the audio frequency amplifier off when the phase locked loop does not find said tone signal.

8. The squeich circuit for the amplitude modulated RF receiver of claim 7, wherein:
   (a) the frequency modulating means is an oscillator connected to the input of a voltage controlled oscillator, and the output of the voltage controlled oscillator is connected to a phase comparator, both the voltage controlled oscillator and the phase comparator being elements of the phase locked loop circuit.

* * * * *